United States Patent
Ogawa et al.

(10) Patent No.: US 8,124,932 B2
(45) Date of Patent: Feb. 28, 2012

(54) CHARGED PARTICLE BEAM APPARATUS AND METHOD ADJUSTING AXIS OF APERTURE

(75) Inventors: Takashi Ogawa, Chiba (JP); Yo Yamamoto, Chiba (JP); Hiroshi Matsumura, Chiba (JP)

(73) Assignee: SII NanoTechnology Inc. (JP)

( * ) Notice: Subject to any disclaimer, the term of this patent is extended or adjusted under 35 U.S.C. 154(b) by 260 days.

(21) Appl. No.: 12/310,149

(22) PCT Filed: Aug. 3, 2007

(86) PCT No.: PCT/JP2007/065237
§ 371 (c)(1),
(2), (4) Date: Apr. 24, 2009

(87) PCT Pub. No.: WO2008/023559
PCT Pub. Date: Feb. 28, 2008

(65) Prior Publication Data
US 2009/0242757 A1    Oct. 1, 2009

(30) Foreign Application Priority Data
Aug. 23, 2006 (JP) .................................. 2006-226867

(51) Int. Cl.
*G01N 23/00* (2006.01)
(52) U.S. Cl. ........................ 250/306; 250/307; 250/310
(58) Field of Classification Search ....................... None
See application file for complete search history.

(56) References Cited

U.S. PATENT DOCUMENTS

| | | | | |
|---|---|---|---|---|
| 4,205,226 A | * | 5/1980 | Gerlach | 250/305 |
| 4,429,222 A | * | 1/1984 | Yonezawa | 250/311 |
| 4,801,352 A | * | 1/1989 | Piwczyk | 156/345.5 |
| 4,933,565 A | * | 6/1990 | Yamaguchi et al. | 250/492.2 |
| 5,157,700 A | * | 10/1992 | Kurosawa et al. | 378/34 |
| 5,166,949 A | * | 11/1992 | Perlmutter | 372/94 |
| 5,523,576 A | * | 6/1996 | Koike et al. | 250/491.1 |

(Continued)

FOREIGN PATENT DOCUMENTS
JP      59181448 A   *   10/1984

OTHER PUBLICATIONS

"Basic and Application of Scanning Electron Microscope", Kyoritsu Shuppan K.K. Oct. 25, 1991, p. 78-79.

*Primary Examiner* — Phillip A Johnston
*Assistant Examiner* — Andrew Smyth
(74) *Attorney, Agent, or Firm* — Adams & Wilks

(57) ABSTRACT

A charged particle beam apparatus includes a charged particle source, an aperture, an object lens, an observing unit, an aperture driving portion, and a control portion. The control portion includes a spot pattern forming portion that forms a plurality of spot patterns on a surface of a sample by irradiating a charged particle beam, an analyzing portion that calculates a position of a spot center of the spot pattern and a geometrical center position of a halo, and an adjusting position determining portion that calculates an adjusting position based on a position of intersecting lines connecting the positions of the spot centers of the respective spot patterns and the center position of the halo. In this manner, the position of the aperture can be easily and accurately adjusted in a short period of time by moving the center axis of the aperture to the adjusting position.

15 Claims, 11 Drawing Sheets

U.S. PATENT DOCUMENTS

| | | | | |
|---|---|---|---|---|
| 5,524,131 A * | 6/1996 | Uzawa et al. | | 378/34 |
| 5,654,996 A * | 8/1997 | Steinberg et al. | | 378/65 |
| 5,822,389 A * | 10/1998 | Uzawa et al. | | 378/34 |
| 5,852,298 A * | 12/1998 | Hatakeyama et al. | | 250/492.2 |
| 5,867,468 A * | 2/1999 | Mori et al. | | 369/112.12 |
| 6,476,388 B1 * | 11/2002 | Nakagaki et al. | | 850/9 |
| 6,486,943 B1 * | 11/2002 | Burns et al. | | 356/124 |
| 6,498,685 B1 * | 12/2002 | Johnson | | 359/626 |
| 6,507,034 B1 * | 1/2003 | Nakasugi | | 250/492.22 |
| 6,583,413 B1 * | 6/2003 | Shinada et al. | | 850/9 |
| 6,670,611 B1 * | 12/2003 | Kruit et al. | | 850/9 |
| 6,750,455 B2 * | 6/2004 | Lo et al. | | 250/346 |
| 2002/0149381 A1 * | 10/2002 | Lo et al. | | 324/751 |
| 2002/0175295 A1 * | 11/2002 | Gordon et al. | | 250/491.1 |
| 2003/0001095 A1 * | 1/2003 | Lo et al. | | 250/346 |
| 2003/0047691 A1 * | 3/2003 | Musil et al. | | 250/492.2 |
| 2004/0119022 A1 * | 6/2004 | Sato et al. | | 250/396 R |
| 2005/0045821 A1 * | 3/2005 | Noji et al. | | 250/311 |
| 2005/0199811 A1 * | 9/2005 | Ishitani et al. | | 250/311 |
| 2005/0214958 A1 * | 9/2005 | Nakasuji et al. | | 438/14 |
| 2005/0253083 A1 * | 11/2005 | Sato et al. | | 250/398 |
| 2006/0033037 A1 * | 2/2006 | Kawasaki et al. | | 250/398 |
| 2006/0043293 A1 * | 3/2006 | Doi et al. | | 250/310 |
| 2006/0108542 A1 * | 5/2006 | Ito et al. | | 250/491.1 |
| 2006/0163497 A1 * | 7/2006 | Kodama et al. | | 250/492.21 |
| 2006/0169900 A1 * | 8/2006 | Noji et al. | | 250/310 |
| 2006/0181690 A1 * | 8/2006 | Nishinaga et al. | | 355/53 |
| 2008/0095312 A1 * | 4/2008 | Rodenburg et al. | | 378/87 |
| 2009/0212213 A1 * | 8/2009 | Nakasuji et al. | | 250/310 |

* cited by examiner

CHARGED PARTICLE BEAM APPARATUS AND METHOD ADJUSTING AXIS OF APERTURE

CROSS-REFERENCE TO RELATED APPLICATIONS

This application is a U.S. national stage application of International Application No. PCT/JP2007/065237 filed Aug. 3, 2007, claiming a priority date of Aug. 23, 2006, and published in a non-English language.

TECHNICAL FIELD

The present invention relates to a charged particle beam apparatus for carrying out working, observing a sample, or the like by irradiating a charged particle beam to the sample and a method of adjusting an axis of an aperture of a charged particle beam apparatus.

BACKGROUND ART

In a background art, a charged particle. beam apparatus of carrying out working, observation or the like by irradiating a charged particle beam of an ion beam, an electron beam or the like to a predetermined position has been used in various fields. As a charged particle beam apparatus, there is, for example, a scanning electron microscope (SEM) capable of irradiating an electron beam as a charged particle beam, or a focused ion beam apparatus (FIB) capable of irradiating a focused ion beam as a charged particle beam or the like. According to a scanning electron microscope, a state of a surface of the sample can be observed by detecting a secondary electron generated from the surface of the sample while scanning an electron beam on the surface of the sample. Further, according to the focused ion beam. apparatus, the surface of the sample can be observed by detecting a secondary electron similar to a scanning electron microscope, etching or deposition of a sample can be carried out by making an acceleration voltage high, and the focused ion beam apparatus is used for forming a sample of TEM (transmission electron microscope), correcting a photomask or the like. Further, in recent years, in a focused ion beam apparatus, attention is paid to a method of realizing a low damage working by using the focused ion beam apparatus in a low acceleration region of setting an acceleration voltage of a focused ion beam to about 100 V through 5000 V. Further, attention is also paid to a method of realizing a large area working of wire bonding, solder bump or the like by using a focused ion beam apparatus within a range of an acceleration voltage of about 3000 V in a large current region of constituting an amount of irradiating a focused ion beam to be equal to or higher than 1 nA.

Meanwhile, according to the charged particle beam apparatus, in order to carry out accurate observation or working, it is necessary to remove dimming referred to as off-axis aberration in accordance with adjusting a focal point position. An off-axis aberration is generated by a center of a charged particle beam that does not pass a center axis of an object lens, further specifically, caused by a deviation that is brought about between a center axis of an aperture of narrowing a charged particle beam to be incident on an object lens and a center axis of the object lens. Therefore, in order to carry out accurate observation or working by removing an off-axis aberration, it is necessary to adjust a position of the center axis of the aperture to coincide with the center axis of the object lens before being used.

In a background art, such an off-axis aberration has been removed specifically by the following method. That is, a center axis of an aperture is made to be disposed at an arbitrary position, and an image in a state of over focal point and an image in a state of under focal point are alternately acquired by adjusting a focal point position of the object lens. In a state in which the center axis of the aperture and the center of the object lens do not substantially coincide with each other, a position of the image described in the state of the over focal point and a position of the image described in the state of under focal point differ from each other, and therefore, when the focal point position of the object lens is changed, the acquired image is much changed. Further, the center axis of the aperture and the center axis of the object lens are made to coincide with each other by making the position of the image remain unchanged even when the focal point position is changed by repeating the above-described operation while adjusting the center axis of the aperture (refer to, for example, Nonpatent Reference 1).

Further, as another method, respectively in a state of over focal point and a state of under focal point, a charged particle beam is scanned on a knife edge, and an error of a current value detected by the knife edge by the state of over focal point and the state of under focal point is calculated. Further, a method of repeatedly changing to adjust a position of an aperture until the error of the current value falls in a predetermined range has been proposed (refer to, for example, Patent Reference 1). Nonpatent Reference 1: "Basic and Application of Scanning Electron Microscope", Kyoritsu Shuppan K.K. Oct. 25, 1991, p.78-79
Patent Reference 1: JP-A-2005-276639
Problems that the Invention is to Solve However, in the method according to Nonpatent Reference 1, a deviation of the center axis of the aperture is grasped only qualitatively from a change between the image in the over focal point state and the image in the under focal point state, and therefore, the adjustment of the center axis of the aperture can be realized by repeatedly carrying out the adjustment by manual operation based on the above-described phenomenon and an empirical rule. Therefore, in adjusting the center axis of the aperture, there poses a problem that technique of an operator and enormous time are needed. Particularly, when used in a large current region as described above, a working speed is fast, and therefore, a method of carrying out an adjusting operation swiftly to minimize damage of the sample is desired. Further, an adjusting accuracy is dispersed among respective operators, further, even when adjusted by the same operator, it is difficult to unify the adjusting accuracy among different apparatus, and a problem of bringing about a dispersion in a performance among apparatus is posed. Further, when the charged particle beam is irradiated in a low acceleration region as described above, the aberration of the charged particle beam is enlarged and dimming is brought about also owing to the fact that the acceleration voltage is a low voltage. Therefore, an aberration caused by the deviation of the center axis of the aperture and an aberration caused by the acceleration voltage cannot be separated from each other, and a problem that the center axis of the aperture cannot accurately be adjusted is posed.

Further, although in the method according to Patent Reference 1, the deviation of the aperture can be evaluated and adjusted quantitatively to some degree by the error of the current value and a correlative relationship between the error of the current value and the deviation of the aperture is not clear, and the deviation needs to be adjusted by repeatedly carrying out the adjusting operation. Therefore, similar to Nonpatent Reference 1, a problem of needing enormous time in adjustment is posed.

The invention has been carried out in view of the above-described situation and provides a charged particle beam apparatus and a method of adjusting an axis of an aperture capable of adjusting a position of a center axis of an aperture in a short period of time, easily and accurately.

Means for Solving the Problems

In order to resolve the above-described problem, the invention proposes the following means.

A charged particle beam apparatus of the invention is characterized by including a charged particle source of emitting a charged particle beam, an aperture for narrowing the charged particle beam to a predetermined diameter, an object lens for focusing the charged particle beam narrowed by the aperture to irradiate to a sample, observing means capable of acquiring an image of a surface of the sample, an aperture driving portion capable of moving a center axis of the aperture in an X direction and a Y direction constituting two axes substantially orthogonal to each other relative to the center axis, and a control portion capable of adjusting a position of the center axis of the aperture relative to a center axis of the object lens by moving the aperture by the aperture driving portion, wherein the control portion includes spot pattern forming means of forming a plurality of spot patterns on the surface of the sample by irradiating the charged particle beam to the sample by a plurality of times by moving the aperture to a position different in the X direction and the Y direction by the aperture driving portion, analyzing means for calculating positions of spot centers constituting centers of the respective spot patterns formed at the sample and a geometrical center position of a halo constituting an outer edge thereof from the image acquired by the observing means, and adjusting position determining means for calculating an adjusting position of the center axis of the aperture based on a position of intersecting lines of connecting the positions of the spot centers of the respective spot patterns and the center position of the halo calculated by the analyzing means, and wherein a position of the aperture is adjusted by moving the center axis of the aperture to the adjusting position calculated by the adjusting position determining means.

Further, the invention is directed to a method of adjusting an axis of an aperture of adjusting a position of a center axis of an aperture relative to a center axis of an object lens with regard to a charged particle beam apparatus for narrowing a charged particle beam emitted from a charged particle source to a predetermined diameter by the aperture and focusing the charged particle beam by the object lens to be irradiated to a sample, the method is characterized by including a spot pattern forming step of forming a plurality of spot patterns on a surface of the sample by making the position of the center axis of the aperture differ in an X direction and a Y direction constituting to two axes substantially orthogonal to the center axis and irradiating the charged particle beam to the previously prepared sample by a plurality of times, a spot analyzing step of calculating positions of spot centers constituting centers of the respective spot patterns and a geometrical center position of a halo constituting an outer edge thereof, an adjusting position determining step of calculating an adjusting position of the center axis of the aperture based on positions of intersecting lines connecting the center positions of the halos of the respective spot patterns and the position of the spot center, and a center axis position adjusting step of moving the center axis of the aperture to the calculated adjusting position.

According to the charged particle beam apparatus and the method of adjusting the axis of the aperture according to the invention, as the spot pattern forming step, the plurality of spot patterns are formed on the surface of the sample. That is, the spot pattern forming means of the control portion irradiates the charged particle beam to an arbitrary position of the surface of the sample by emitting the charged particle beam from the charged particle source. Thereby, at the arbitrary position of the surface of the sample, the spot pattern of a predetermined size is formed in accordance with a focal point state of the irradiated charged particle beam. Next, the spot pattern forming means of the control portion forms the spot pattern by moving the center axis of the aperture in the X direction and the Y direction by the predetermined moving amounts by the aperture driving portion and irradiating again the charged particle beam. Each of the plurality of spot patterns formed in this way shows a shape having the spot center constituting the center and the halo constituting the outer edge. The halo shows a range of irradiating the charged particle beam on the surface of the sample. Further, when the center axis of the aperture is positionally shifted relative to the center axis of the object lens, the spot center is formed at a position eccentric in the direction in correspondence with the direction of the positional shift of the center axis of the aperture relative to the geometrical center position of the halo.

Next, as the spot pattern analyzing step, the formed spot pattern is analyzed. That is, the analyzing means of the control portion calculates the positions of the spot centers of the respective spot patterns and the position of the geometrical center of the halo described in the image of the surface of the sample acquired by the observing means. Next, as the adjusting position determining step, the adjusting position of the center axis of the aperture at which the center axis of the aperture and the center axis of the object lens substantially coincides with each other is determined. That is, the adjusting position determining means of the control portion calculates the position of intersecting the lines of connecting the positions of the spot centers of the respective spot patterns and the center position of the halo as the adjusting position from a result of the spot pattern analyzing step. Finally, as the center axis position adjusting step, the control portion can bring about the state in which the center axis of the aperture substantially coincide with center axis of the object lens by moving the center axis of the aperture to the calculated adjusting position by the aperture driving portion.

Further, it is made to be further preferable that the above-described charged particle beam apparatus further includes scanning means capable of moving a position of irradiating the charged particle beam relative to the sample, wherein the spot pattern forming means of the control portion moves the position of irradiating the charged particle beam relative to the sample by the scanning means by amounts of amounts of moving the aperture respectively in the X direction and the Y direction multiplied by a constant value at every time of irradiating the charged particle beam to the sample by moving the center axis of the aperture.

Further, it is made to further preferable in the above-described method of adjusting the axis of the aperture that at the spot pattern forming step, a position of irradiating the charged particle beam is moved relative to the sample by amounts of respective moving amounts in the X direction and the Y direction of the aperture multiplied by a constant value at every time of irradiating the charged particle beam to the sample by moving the center axis of the aperture.

According to the charged particle beam apparatus and the method of adjusting the axis of the aperture according to the invention, when the plurality of spot patterns are formed at the spot pattern forming step, the center axis of the aperture is made to be disposed at the position which differs in the X direction and the Y direction, and the position of irradiating the charged particle beam is moved relative to the sample by the scanning means. Therefore, the plurality of spot patterns can be formed not to overlap each other on the surface of the sample, the image capable of further clearly identifying the spot pattern can be acquired, and the axis can be adjusted further accurately. At this occasion, by constituting the relative moving amount of the position of irradiating the charged particle beam by the amounts of the amounts of moving the center axis of the aperture in the X direction and the Y direction multiplied by the constant value, the moving direction can be made to coincide with the direction of positionally shifting the center axis of the aperture relative to the center axis of the object lens. Therefore, even when the position of irradiating is relatively moved as described above, at a search position determining step, the search position can be determined similarly based on the position of intersecting the lines of connecting the positions of the spot centers and the center position of the halo.

Further, it is made to be further preferable in the above-described charged particle beam apparatus that the control portion sets the charged particle beam to the sample in a state of an over focal point when the charged particle beam is irradiated to the sample by the spot pattern forming means.

Further, it is made to be further preferable in the above-described method of adjusting the axis of the aperture that at the spot pattern forming step the charged particle beam focused by the object lens is irradiated to the sample in a state of an over focal point.

According to the charged particle beam apparatus and the method of adjusting the axis of the aperture according to the invention, at the spot pattern forming step, by setting the charged particle beam in the state of the over focal point by the spot pattern forming means of the control portion to irradiate to the sample, in comparison with a state of an under focal point, the formed spot pattern can be formed to be larger. Therefore, at the spot pattern analyzing step, the spot pattern can further clearly be identified from the acquired image and a further accurate axis adjustment can be carried out.

Further, it is made to be further preferable in the above-described charged particle beam apparatus that the analyzing means of the control portion constitutes a binarized data constituted by processing to binarize the image acquired from the observing means and calculates the center position of the halo and the position of the spot center of the spot pattern based on the binarized data.

Further, it is made to be further preferable in the above-described method of adjusting the axis of the aperture that at the spot pattern analyzing step, a binarized data of processing to binarize the image of the surface of the sample formed with the spot pattern is formed, and the center positions of the halos of the respective spot patterns and the position of the spot center are calculated from the binarized data.

According to the charged particle beam apparatus and the method of adjusting the axis of the aperture according to the invention, at the spot pattern analyzing step, by constituting the binarized data of processing to binarize the image by the analyzing means of the control portion, the spot pattern displayed on the image can further clearly be identified and the further accurate axis adjustment can be carried out.

ADVANTAGE OF THE INVENTION

According to the charged particle beam apparatus of the invention, by only providing the spot pattern forming means, the analyzing means, the adjusting position determining means as the control portion and forming the plurality of spot patterns at the sample, the position of the center axis of the aperture can be adjusted automatically, easily and accurately in the short period of time.

Further, according to the method of adjusting the axis of the aperture of the invention, by only providing the spot pattern forming step, the spot pattern analyzing step, the adjusting position determining step, and forming the plurality of spot patterns to the sample, the position of the center axis of the aperture can be adjusted easily and accurately in the short period of time and automation is applicable thereto.

DESCRIPTION OF REFERENCE NUMERALS AND SIGNS

Figure 1:
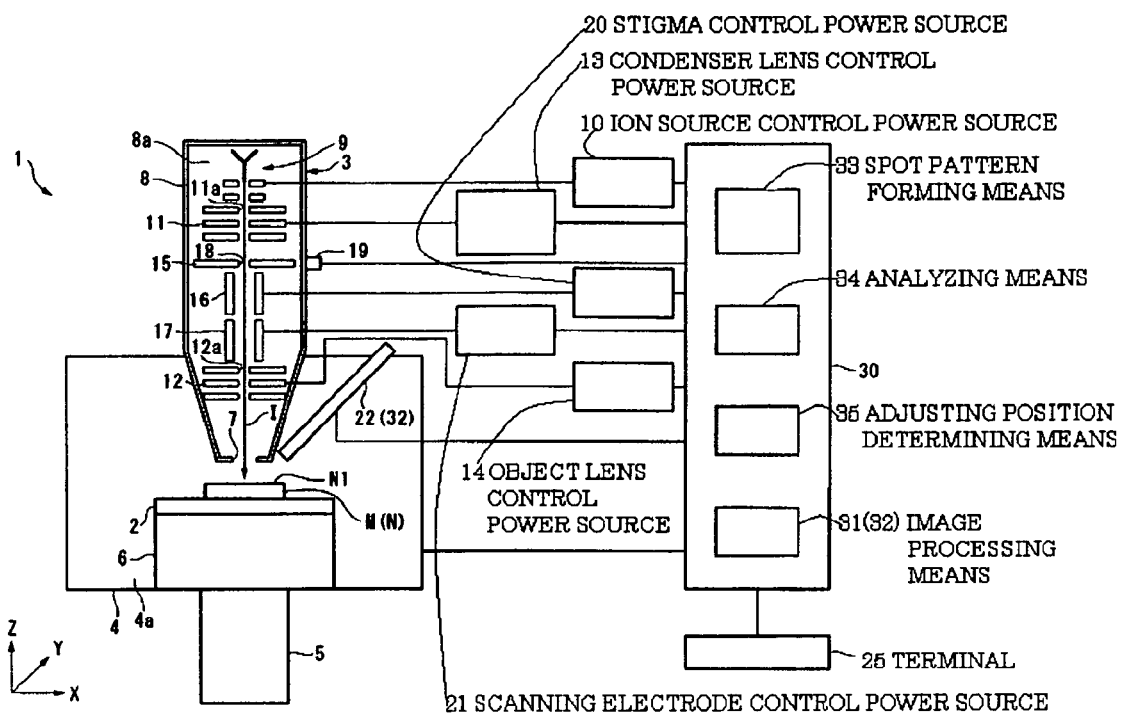
FIG. 1 is a schematic view of a charged particle beam apparatus according to a first embodiment of the invention.

1 focused ion beam apparatus (charged particle beam apparatus)
9 ion source (charged particle source)
12 object lens
L12 center of object lens
18 scanning electrode (scanning means) aperture
L18 center axis of aperture
19 aperture driving portion
30 control portion
32 observing means
33 spot pattern forming means
34 analyzing means
35 adjusting position determining means
I ion beam (charged particle beam)
M sample
N standard sample (sample)
N1 surface
P, Q, O, R, P' spot patterns
P1, Q1, O1, R1 halos P2, Q2, O2, R2 spot centers
P3, Q3, O3, R3 centers of halos
S2 spot pattern forming step
S4 spot pattern analyzing step
S5 adjusting position determining step
S6 center axis position adjusting step

DETAILED DESCRIPTION OF THE INVENTION

First Embodiment

FIG. 1 shows a first embodiment according to the invention. As shown by FIG. 1, a focused ion beam apparatus (FIB) 1 constituting a charged particle beam apparatus carries out working of a surface of a sample M or the like by irradiating an ion beam I constituting a charged particle beam to the sample M. For example, a sample for observation by TEM (transmission electron microscope) can be fabricated by arranging, for example, a wafer as the sample M, or a photomask can be corrected or the like by constituting a photomask in photolithography technology as the sample M. Details of the focused ion beam apparatus 1 according to the embodiment will be explained as follows.

As shown by FIG. 1, the focused ion beam apparatus 1 includes a sample base 2 capable of arranging the sample M, and an ion beam lens-barrel 3 capable of irradiating the ion beam I to the sample M arranged at the sample base 2. The sample base 2 is arranged at an inner portion 4a of a vacuum chamber 4. The vacuum chamber 4 is provided with a vacuum pump 5 and the inner portion 4a can be exhausted to a high vacuum atmosphere. Further, the sample base 2 is provided with a three axes stage 6 and the sample M can be moved in Z direction constituting a direction of irradiating the ion beam I, X direction and Y direction constituting two axes substantially orthogonal to Z direction.

The ion beam lens-barrel 3 includes a cylinder member 8 formed with an irradiation port 7 communicated with the vacuum chamber 4 at a front end thereof, and an ion source 9 constituting a charged particle source contained on a base end side thereof at an inner portion 8a of the cylinder member 8. An ion constituting the ion source 9 is, for example, gallium ion ($Ga^+$) or the like. The ion source 9 is connected to an ion source control power source 10. Further, by applying an acceleration voltage and an extracting voltage by the ion source control power source 10, an ion extracted from the ion source 9 can be accelerated to be discharged as the ion beam I.

Further, at the inner portion 8a of the cylinder member 8, a front end side of the ion source 9 is provided with a condenser lens 11 and an object lens 12 as an optical system of focusing the ion beam I emitted from the ion source 9. The condenser lens 11 and the object lens 12 are adjusted such that respective center axes thereof coincide with each other in a state of being substantially in parallel with Z direction. The condenser lens 11 and the object lens 12 are electrostatic lenses formed by 3 sheets of electrodes formed with through holes 11a, 12a, and respectively connected to a condenser lens control power source 13, an object lens control power source 14. By applying a voltage to the condenser lens 11 by the condenser lens control power source 13, the ion beam I passing the through hole 11a and brought into a diverging state can be focused. Further, by applying the voltage to the object lens 12 by the object lens control power source 14, the ion beam I passing the through hole 12a can further be focused to be irradiated to the sample M as a focused ion beam.

Further, a movable aperture 15, a stigma 16, and a scanning electrode 17 constituting scanning means are provided successively from the base end side between the condenser lens 11 and the object lens 12. The movable aperture 15 includes an aperture 18 constituting a through hole having a predetermined diameter, and an aperture driving portion 19 for moving the aperture 18 in X direction and Y direction. The aperture 18 narrows the ion beam I irradiated from the condenser lens 11 in accordance with its diameter. Although according to the embodiment, only a single aperture 18 is provided, there may be constructed a constitution having a plurality thereof by making the diameters thereof different from each other and capable of selecting the aperture of a preferable diameter by moving the aperture by the aperture driving portion 19. Further, the stigma 16 is for correcting astigmatism of the passing ion beam I, which is carried out by applying a voltage from a stigma control power source 20. Further, the scanning electrode 17 can deflect the passing ion beam I in X direction and Y direction by a predetermined amount, thereby, the ion beam I can be scanned on the sample M, or an irradiating position can be shifted to irradiate to a predetermined position.

Further, the ion source control power source 10, the condenser lens control power source 13, the object lens control power source 14, the stigma control power source 20, and the scanning electrode control power source 21 described above are connected to the control portion 30. That is, by controlling the respective power sources by the control portion 30, the ion beam I of a predetermined acceleration voltage and current can be focused to irradiate to a predetermined position of the sample M. Further, the control portion 30 is connected with a terminal 25, and the ion beam I can be irradiated to the sample M also by setting various conditions by the terminal 25. Further, the aperture driving portion 19 and the three axes stage 6 are also connected to the control portion 30, and the aperture 18 can be adjusted, further, the position of the sample M can be adjusted under control by the control portion 30. Further, the focused ion beam apparatus 1 is provided with a secondary electron detector 22 capable of detecting a secondary electron generated from the sample M when the ion beam I is irradiated to the sample M, and a result of detection can be outputted to image processing means 31 of the control portion 30. The image processing means 31 can acquire a state of a surface of the sample M as an image from the result of detection, that is, observing means 32 is constituted by the secondary electron detector 22 and the image processing means 31. Further, image data acquired by the observing means 32 can be monitored by the terminal 25.

Figure 2:
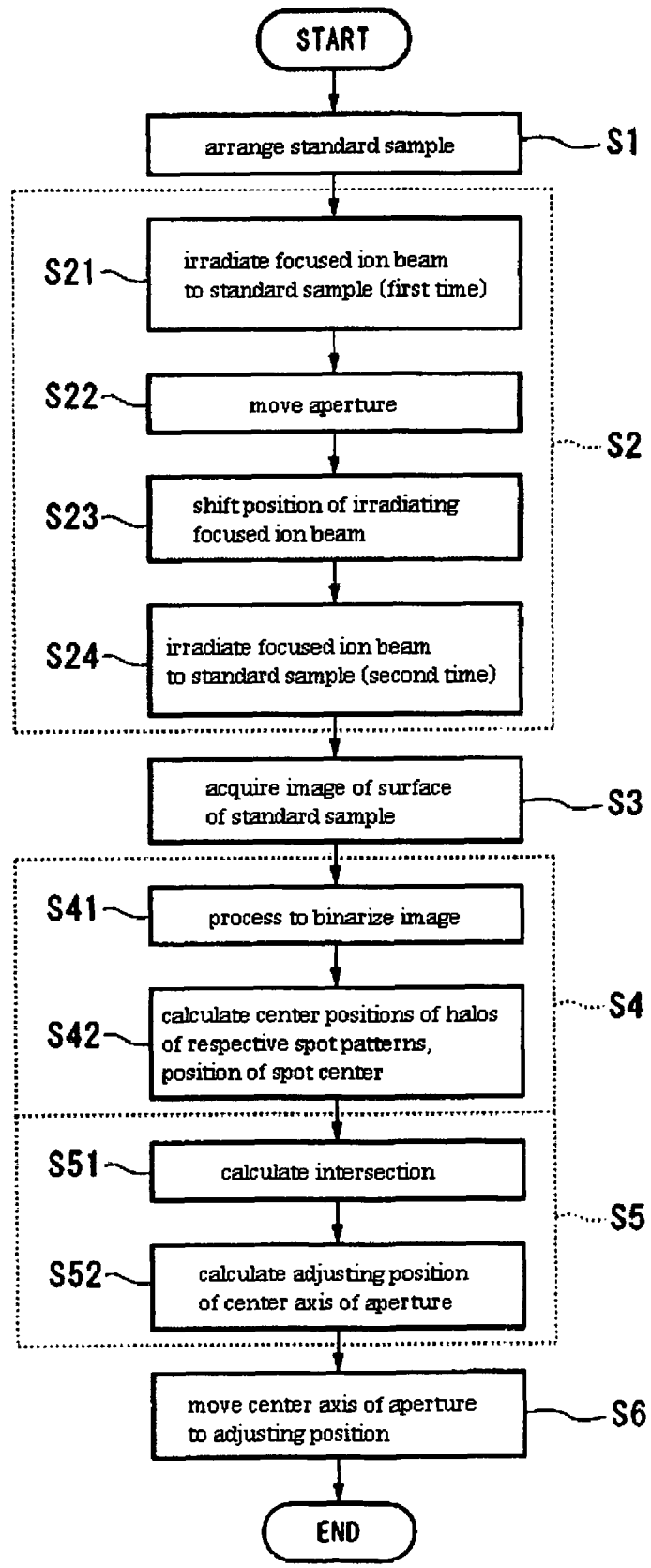
FIG. 2 is a flowchart of adjusting an axis of an aperture according to the first embodiment of the invention.

Here, when a center axis of the object lens 12 and a center axis of the aperture 18 are positionally shifted in X direction and Y direction, dimming referred to as off-axis aberration is brought about in the ion beam I. In a state of bringing about such an off-axis aberration, the ion beam I cannot accurately be irradiated to the predetermined position of the sample M. Therefore, the control portion 30 is provided with spot pattern forming means 33, analyzing means 34, and adjusting position determining means 35 in order to automatically correct the off-axis aberration of observing, working the sample M. An explanation will be given as follows of a procedure of correcting the off-axis aberration by adjusting the axis of the aperture 18 as well as details of operations of respective constitutions of the control portion 30 in reference to the flowchart of FIG. 2.

First, a previously prepared standard sample N is arranged at the sample base 2 (step S1). The standard sample N may preferably be constituted by a material capable of forming an irradiation mark referred to as spot pattern on a surface thereof by irradiating the ion beam I, and the standard sample N preferably includes a flat face for adjusting the axis of the aperture 18. Further, even when the spot pattern is formed on the surface of the sample, so far as the spot pattern is acceptable in observation, working, actually observed, worked sample M may constitute the standard sample N.

Next, as spot pattern forming step S2, a plurality of the spot patterns are formed by irradiating the ion beam I to a plurality of portions of the surface N1 of the standard sample N. First, the spot pattern forming means 33 of the control portion 30 forms a spot pattern P by irradiating the ion beam I at an arbitrary position for a constant period of time at the surface N1 of the standard sample N (step S21). At this occasion, a focal point position of the object lens 12 is brought into a state of over focal point relative to the surface N1 of the standard sample N, that is, a distance between the object lens 12 and the surface N1 of the standard sample N is made to be longer than a focal length. Further, a position of a center axis L18 of the aperture 18 in X direction and Y direction at this occasion is set as an aperture initial position A0 (0, 0), further, an irradiation position on the surface N1 of the standard sample N is set as an initial irradiation position B0 (0, 0).

Figure 3:
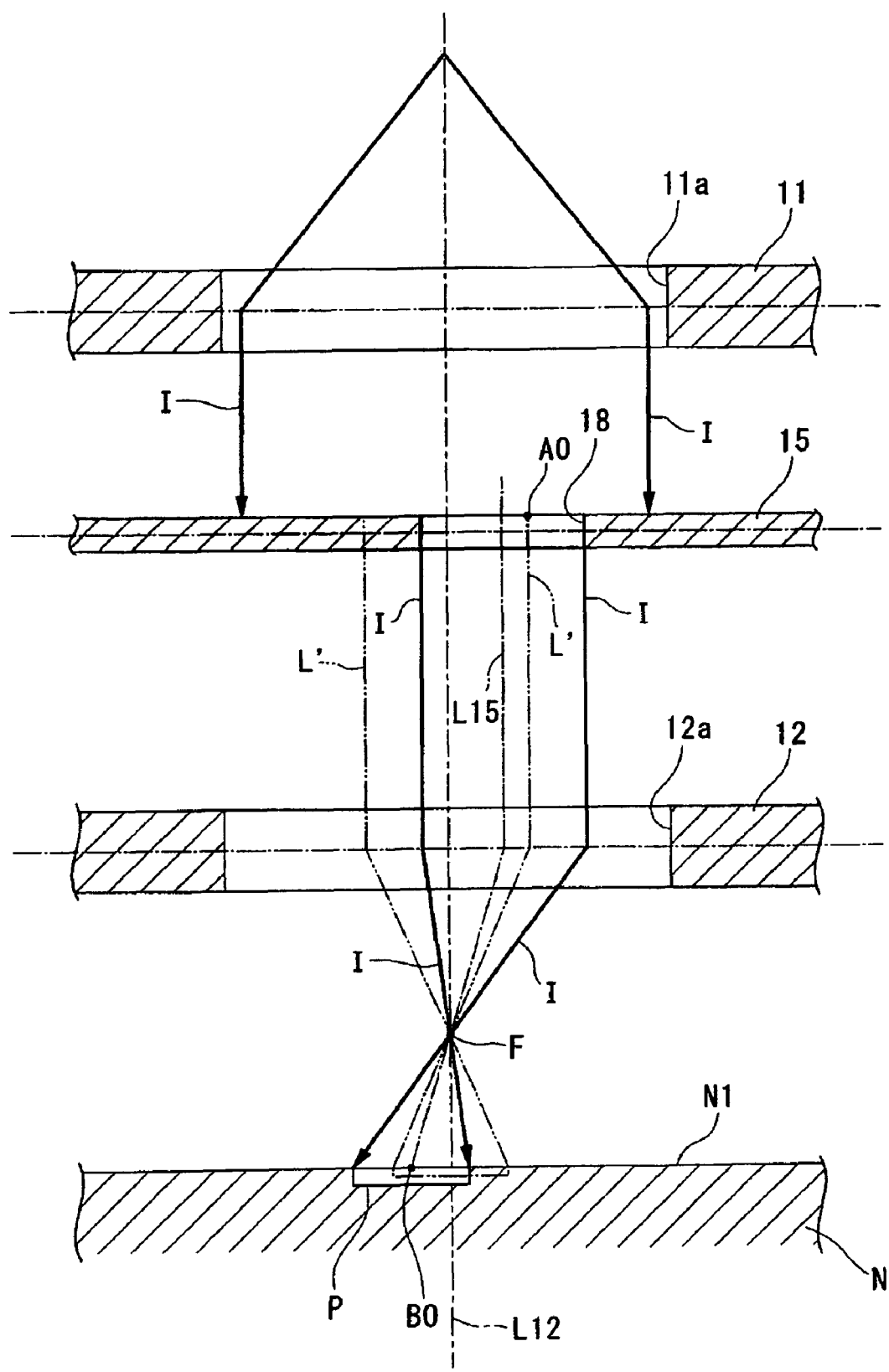
FIG. 3 is an explanatory diagram showing a relationship between a center axis of an aperture and a center axis of an object lens according to the first embodiment of the invention.

FIG. 3 schematically shows a behavior of irradiating the ion beam I. In FIG. 3, as shown by a two-dotted chain line L', when a center axis L15 of the aperture 15 coincides with a center axis L12 of the object lens 12, the ion beam I is irradiated in an irradiation range substantially symmetrical with regard to the center axis L12 of the object lens 12. On the other hand, in the case of the aperture initial position A0 at which the center axis L18 of the aperture 18 is brought into a state of staying to be positionally shifted relative to the center axis L12 of the object lens 12, owing to the state of over focal point, the ion beam I is irradiated to the initial irradiation position B0 in a direction the same as that of the positional shift and eccentric to an opposed side by interposing a focal point position F, and the standard sample N is etched to form the spot pattern P in a range constituting a geometrical center by the initial irradiation position B0.

Figure 4A:
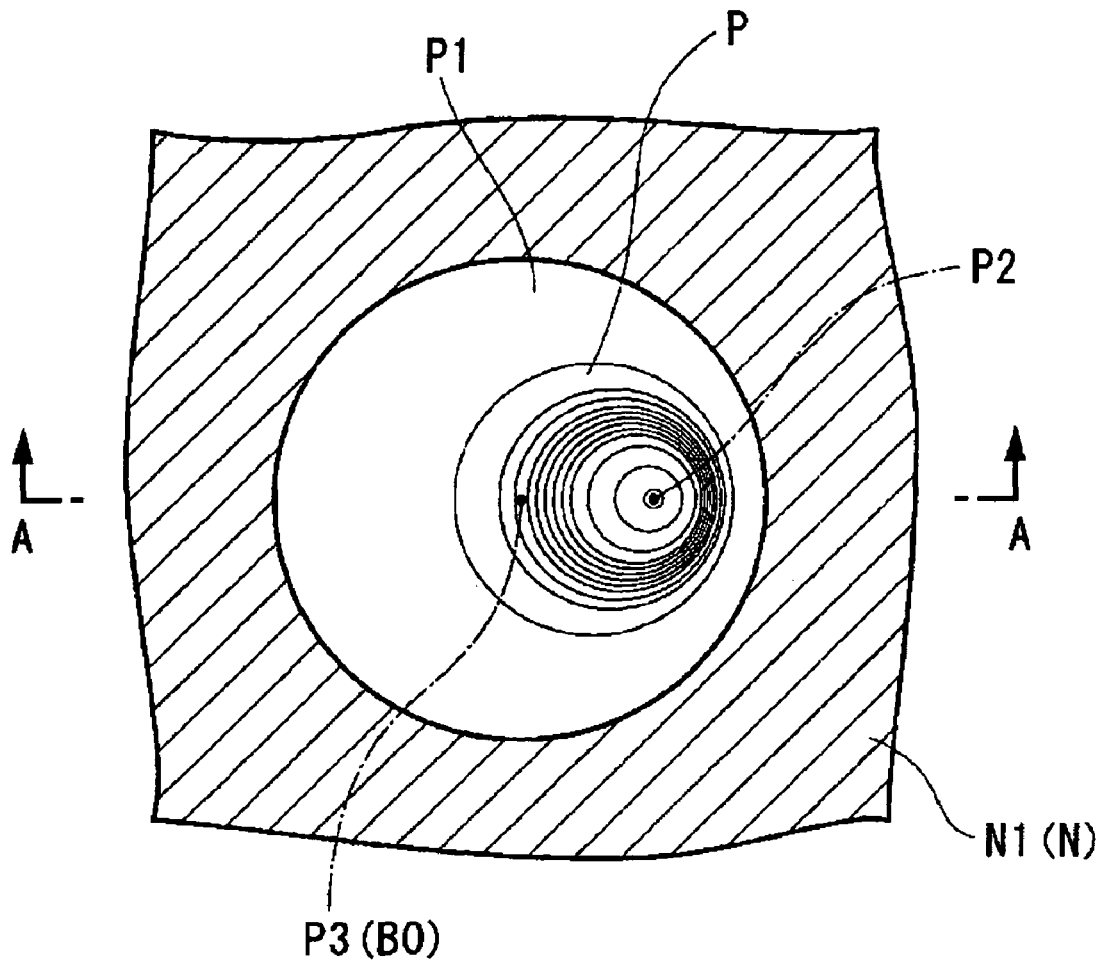
FIG. 4 illustrates detailed views of a spot pattern formed at a spot pattern forming step according to the first embodiment of the invention.
Figure 4B:
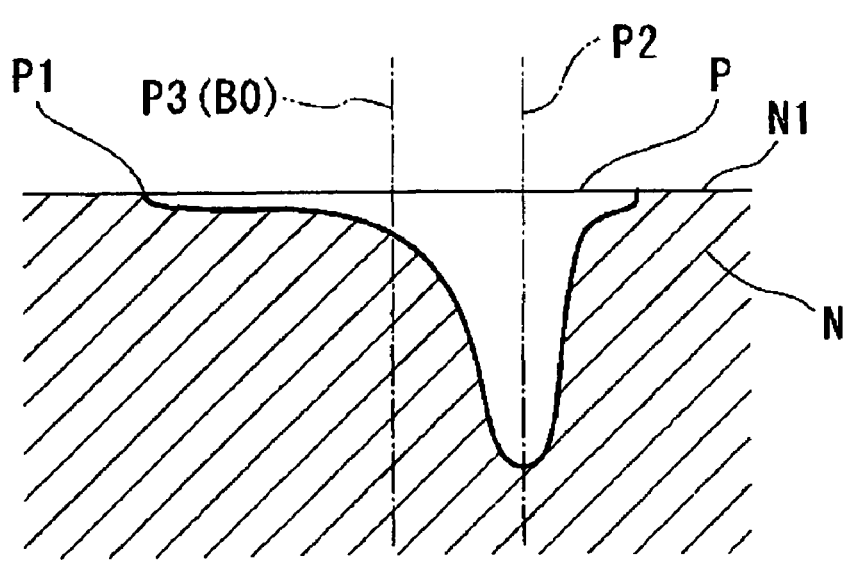

FIG. 4(a) shows an image when the spot pattern P is observed by the observing means 32, and FIG. 4(b) is a sectional view broken by A-A section of FIG. 4(a). As shown by FIGS. 4(a), (b), in the irradiation range of the surface N1 of the standard sample N, a recess is formed by being etched by the ion beam I, the recess is recognized on the image as the spot pattern P. That is, the recess is recognized as a halo P1 substantially in a shape of a circle an outer edge of which is constituted by start of the recess of the surface N1, and the initial irradiation position B0 substantially coincides with a geometrical center P3 of the halo P1. Further, as shown by FIG. 4(b), the spot pattern P shows a sectional shape in which a depth of the recess is deepened rapidly as proceeding to an inner portion. Therefore, as shown by FIG. 4(a), the acquiring image is formed with a gradation substantially in a circular shape in accordance with the depth of the recess at the inner portion of the halo P1, and a spot center P2 is formed at a center thereof. The spot center P2 shows the most deeply etched position. At a vicinity of the spot center P2, the recess is deepened rapidly, and therefore, almost all of the secondary electrons discharged emitted from the vicinity are not detected by the secondary electron detector 22 of the observing means 32. Therefore, in the acquired image, the spot center P2 is recognized as a black point. Here, by positionally shifting the center axis L18 of the aperture 18 relative to the center axis L12 of the object lens 12, the spot center P2 is formed to be positionally shifted relative to the geometrical center P3 of the halo P1. Further, the positionally shifted direction corresponds to a direction of positionally shifting the center axis L18 of the aperture 18 relative to the center axis 12 of the object lens 12.

When the initial spot pattern P is formed in this way, a next spot pattern Q is further formed. First, the spot pattern forming means 33 of the control portion 30 moves the aperture 18 to an aperture position A1 (ΔX1, ΔY1) moved from the aperture initial position A0 (0, 0) by a moving amount ΔX1 in X direction and a moving amount ΔY1 in Y direction which are previously set (step S22). Further, the spot pattern forming means 33 shifts the ion beam I by moving amounts α·ΔX1, α·ΔY1 of amounts of the moving amounts ΔX1, ΔY1 of the aperture 18 multiplied by a previously set constant α by the scanning electrode control power source 21 and the scanning electrode 17 (step S23). Further, a second portion of the spot pattern Q is formed by irradiating the ion beam I to the standard sample N by a constant period of time under the state (step S24).

Figure 5:
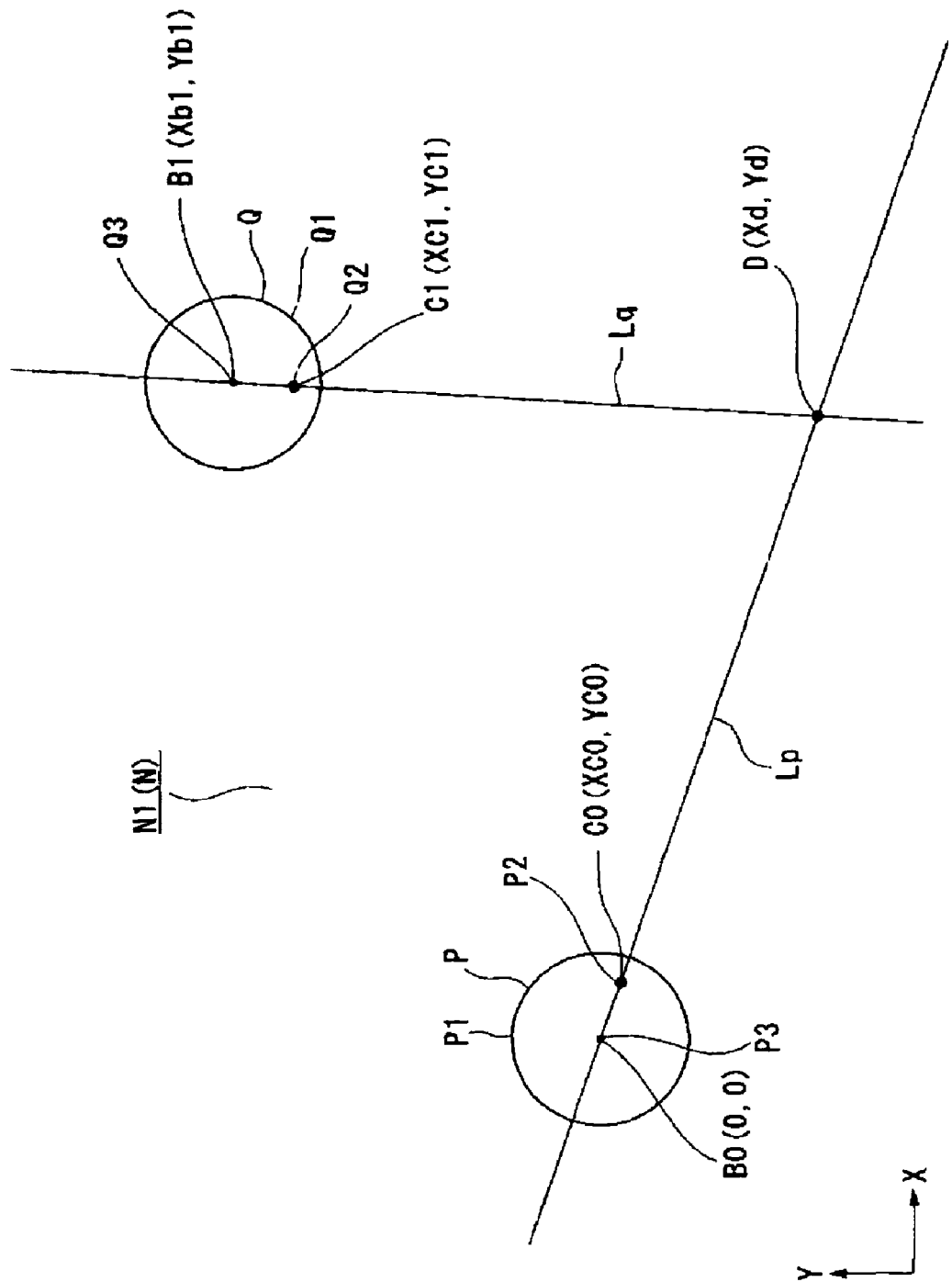
FIG. 5 is a plane view showing an image of a surface of a standard sample formed with the spot pattern according to the first embodiment of the invention.

When the spot patterns P, Q are finished to form on the surface N1 of the standard sample N in this way, an image of the surface N1 of the standard sample N is acquired by the observing means 32 (step S3). That is, the control portion 30 irradiates the ion beam I from the ion source 9 by setting the acceleration voltage to be low by the ion source control power source to scan over a total of the surface N1 of the standard sample N by the scanning electrode 17. Further, secondary electrons emitted from the surface N1 of the standard sample N in accordance with the irradiation are successively detected by the secondary electron detector 22 of the observing means 32, a result thereof is formed into an image by the image processing means 31, thereby, the image of the surface N of the standard sample N can be acquired. FIG. 5 shows the acquired image.

Next, as spot pattern analyzing step S4, the formed spot patterns P, Q are analyzed from the acquired image. First, the analyzing means 34 of the control portion 30 processes to binarize the acquired image to form binarized data (step S41). Thereby, whereas the surface N1 of the standard sample N which is not formed with the spot patterns P, Q becomes black color, the inner portions of the spot patterns P, Q become white color, and the halos P1, Q1 can clearly be identified by contrast. Further, the spot centers P2, Q2 of the spot patterns P, Q become black color and can clearly be identified from other portions of the spot patterns P, Q.

Next, as shown by FIG. 5, based on the binarized data of the image, positions of the centers P3, Q3 of the halos P1, Q1 and the positions of the spot centers P2, Q2 of the respective spot patterns P, Q are calculated (S42). That is, first, from the recognized halo P1, the position of the geometrical center P3 is calculated at a first portion of the spot pattern P, and the position is made to constitute the initial irradiation position B0 (0, 0). Further, by constituting a reference by the initial irradiation position B0 (0, 0), a position C0 (Xc0, Yc0) of the spot center P2 of the spot pattern P is calculated. Further, by constituting a reference by the initial irradiation position B0 (0, 0), the irradiation position B1 (Xb1, Yb1) constituting a geometrical center Q3 of a halo Q1 of a second portion of the spot pattern Q and a position (Xc1, Yc1) of the spot pattern Q2 are calculated.

Figure 6:
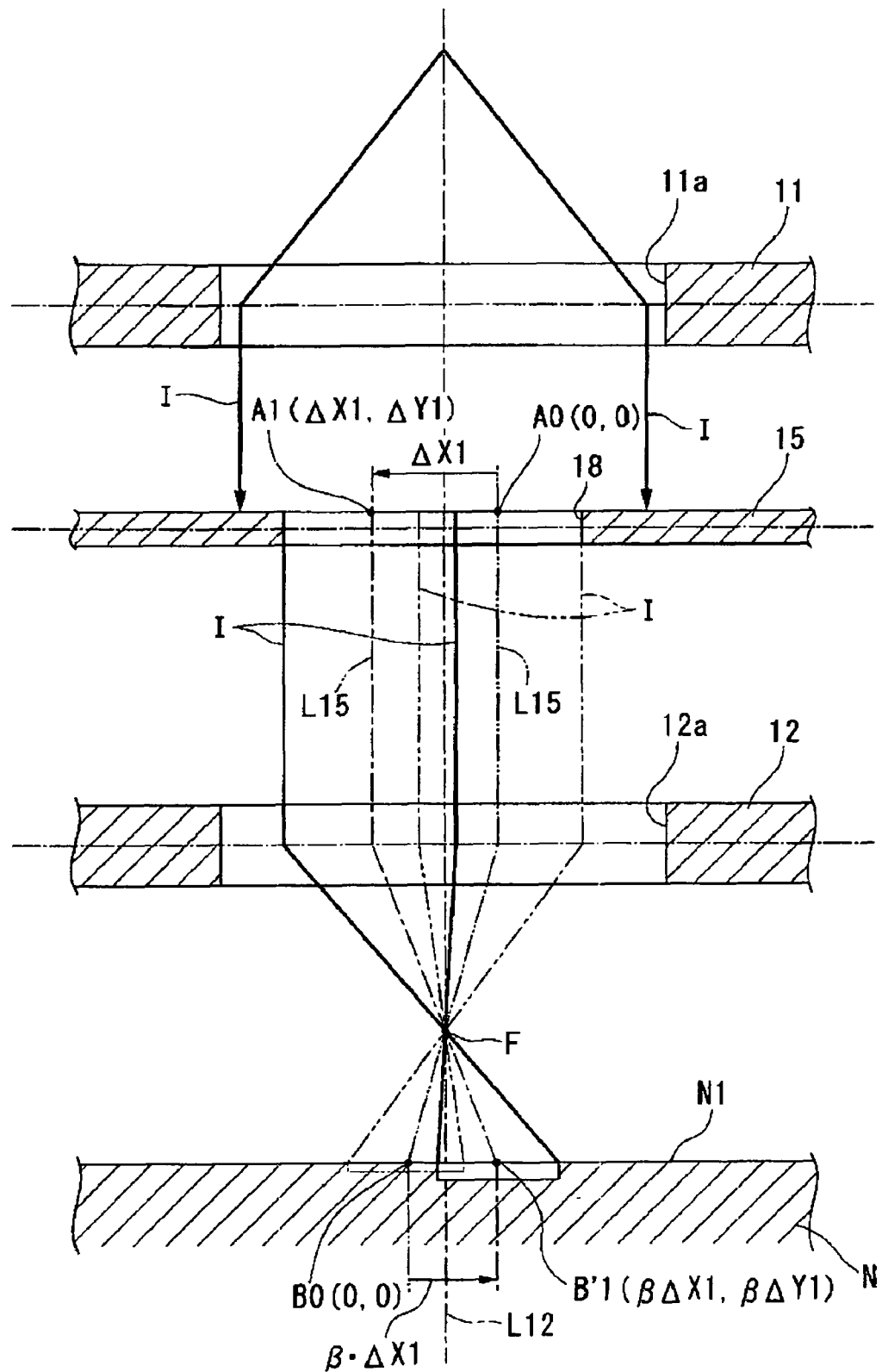
FIG. 6 is an explanatory diagram showing a relationship between the center axis of the aperture at a first portion and a center axis of the aperture at a second portion according to the first embodiment of the invention.

Here, a relationship shown below is established between the initial irradiation position B0 constituting an original point of the first portion and the irradiation position portion B1 of the second portion. As shown by FIG. 6, when the center axis L18 of the aperture 18 is moved from the first portion of the aperture initial position A0 to the second portion of the aperture position A1, since the focal point position F is constant, the irradiation position on the surface N1 of the standard sample N is displaced from the initial irradiation position B0 to the irradiation position B1'. The irradiation position B1' is represented by B1' (βΔX1, βΔY1) from a similarity relationship constituting the reference by the focal point position F by using a coefficient β determined by the moving amounts ΔX1, ΔY1 of the aperture 18 and a position relationship of the focal point position F and the standard sample N. That is, as shown by FIG. 5, a component Xb1 in X direction of the irradiation position B1 irradiated with the ion beam I as the second portion is represented by Xb1=(α+β)·ΔX1 from the moving amount of the aperture 18 and the shift amount of the ion beam I. Similarly, a component Yb1 in Y direction is represented by Yb1=(α+β) ΔY1, that is, the position of the center axis L18 of the aperture 18 and the irradiation position on the surface N1 of the standard sample N are provided with a similarity relationship of a similarity ratio (α+β).

Next, as the adjusting position determining step S5, an adjusting position T capable of making the center axis L18 of the aperture 18 coincide with the center axis L12 of the object lens 12 is calculated. As shown by FIG. 5, the adjusting position determining means 35 of the control portion 30 calculates an intersection D (Xd,Yd) of a linear line Lp connecting the center P3 of the halo P1 and the spot center P2 of the spot pattern P and a linear line Lq of connecting the center Q3 of the halo Q1 and the spot center Q2 of the spot pattern Q based on a calculation result of spot pattern analyzing step S4 (step S51). Next, based on the calculated intersection D, an adjusting position T (Xt, Yt) of the center axis L18 of the aperture 18 constituting the reference by the aperture initial position A0 is calculated.

Here, as described above, the spot center P2 is formed by being positionally shifted in a direction in correspondence with a direction of positionally shifting the center axis L18 of the aperture 18. Therefore, a direction of adjusting the center axis L18 of the aperture 18 relative to the aperture initial position A0 coincides with a direction of the liner line Lp in correspondence therewith. Similarly, a direction of adjusting the center axis L18 of the aperture relative to the aperture position A1 in correspondence with the spot pattern Q coincides with a direction of the linear line Lq in correspondence therewith. Therefore, a component Xt in X direction of the adjusting position T becomes a value of the component Xd in X direction of the intersection D divided by the similarity ratio (α+β) and is calculated by Xt=Xd/(α+β). Similarly, a component Yt in Y direction of the adjusting position T becomes a value of the component Yd in Y direction of the intersection D divided by the similarity ratio (α+β) and is calculated by Yt=Yd/(α+β).

Finally, as center axis position adjusting step S6, the control portion 30 moves the position of the center axis 18 of the aperture 18 to a position constituting the adjusting position T relative to the aperture initial position A0 by driving the aperture driving portion 19. Thereby, the center axis L15 of the aperture 18 is made to substantially coincide with the center axis L12 of the lens 12 and the off-axis aberration can be corrected.

As described above, by forming the plurality of spot patterns P, Q by making the position of the center axis L18 of the aperture 18 differ, the positional shift of the aperture 18 can quantitatively be evaluated and automatically adjusted, and easy and accurate adjustment can be realized in a short period of time. Further, although according to the embodiment, an explanation has been given such that fine adjustment is automatically carried out by the control portion 30, adjustment of the position of the center axis of the aperture can easily and accurately be carried out in a short period of time by the procedure even when the adjustment is carried out by a manual operation. Further, the aperture driving portion 19 and the scanning electrode 17 may be operated by a manual operation such that the center of the halo of the spot pattern is made to coincide with the position constituting the intersection D while confirming the image acquired in real time.

Further, although according to the embodiment, when the next spot pattern is formed, the aperture 18 is moved and the ion beam I is shifted by the scanning electrode 17, the adjustment can be carried out by a similar method even when only the aperture 18 is moved. However, by shifting the ion beam I by the scanning electrode 17, a plurality of formed spot patterns can be formed not to overlap each other. Therefore, the spot pattern can further clearly be identified from the acquired image and further accurate axis adjustment can be carried out. Further, although the scanning electrode 17 is provided as the scanning means and the ion beam I is shifted by the scanning electrode 17, the side of the sample M may be moved in X direction and Y direction by the three axes stage 6 in place thereof. A similar effect can be achieved so far as at least the irradiation position of the ion beam I can be moved relative to the sample M. Further, although at the spot pattern forming step S2, the ion beam I is brought into a state of over focal point, the embodiment is not limited thereto but the ion beam I may be brought into a state of under focal point. Although there may be constituted a focal point state in which at least a spot pattern of a constant size which can be identified is formed, by bringing about a state of over focal point as in the embodiment, the identification can be facilitated by adjusting to a larger spot pattern.

Figure 7:
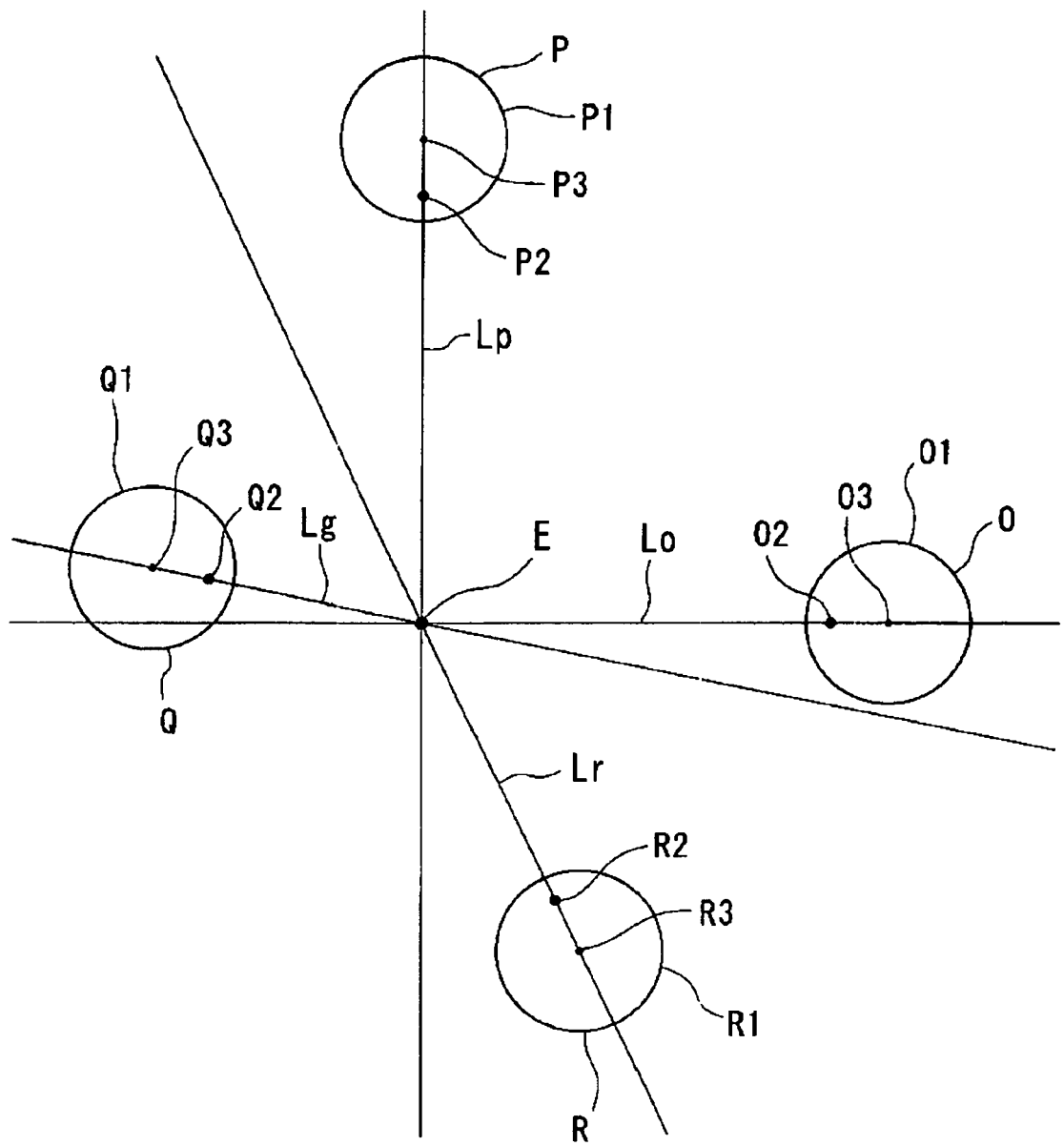
FIG. 7 is a plane view showing an image of a surface of a standard sample formed with a spot pattern according to a modified example of the first embodiment of the invention.

Further, although according to the embodiment, the adjusting position is calculated by forming two portions of the spot patterns, the embodiment is not limited thereto. For example, four portions thereof may be formed. In this case, as shown by FIG. 7, the adjusting position T is calculated from an intersection E of respective linear lines Lo, Lp, Lq, Lr of four spot patterns O, P, Q, R, when the intersection is not carried out at one point by an error or the like, by averaging the intersections, an accuracy can be promoted more than when the intersection is calculated by two portions of the spot patterns. Further, the embodiment is not limited to the axis adjustment of the aperture by carrying out the above-described step only by one time but the step may be repeated by a plurality of times. Thereby, the adjustment can efficiently be carried out and an adjustment accuracy can be promoted by carrying out the adjustment by reducing the magnification of the image by the observing means at a first time, and carrying out the adjustment by increasing the magnification at a second time or thereafter.

Second Embodiment

Figure 8:
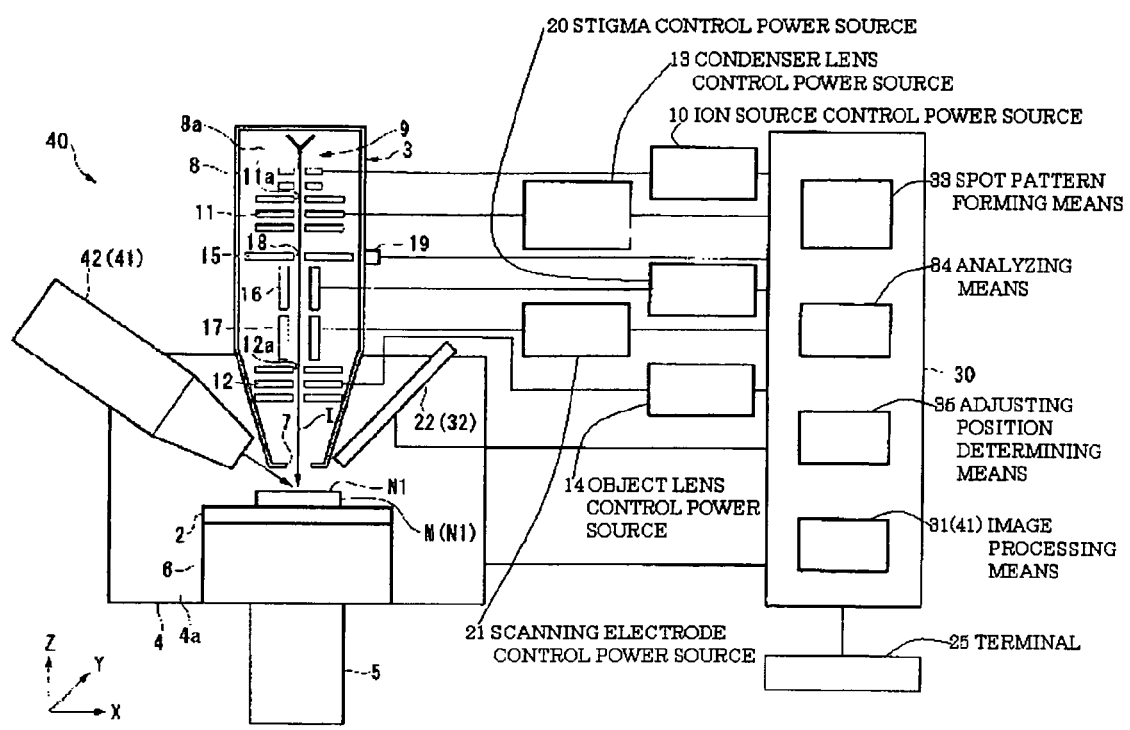
FIG. 8 is a constitution view of a charged particle beam apparatus according to a second embodiment of the invention.

FIG. 8 shows a second embodiment according to the invention. According to the embodiment, members common to member used in the above-described embodiment are attached with the same notations and an explanation thereof will be omitted.

As shown by FIG. 8, a focused ion beam apparatus 40 of the embodiment includes an SEM lens-barrel 42 as observing means 41. According to the embodiment, by using the SEM lens-barrel 42 and the secondary electron detector 22 as means for acquiring the image used in the analyzing step, the axis adjustment of the aperture 18 can be carried out based on a further accurate image. Further, the axis adjustment of the aperture, not illustrated, can be carried out by a similar method not only by the adjustment of the ion beam lens-barrel 3 but the SEM lens-barrel 42.

Third Embodiment

Figure 9:
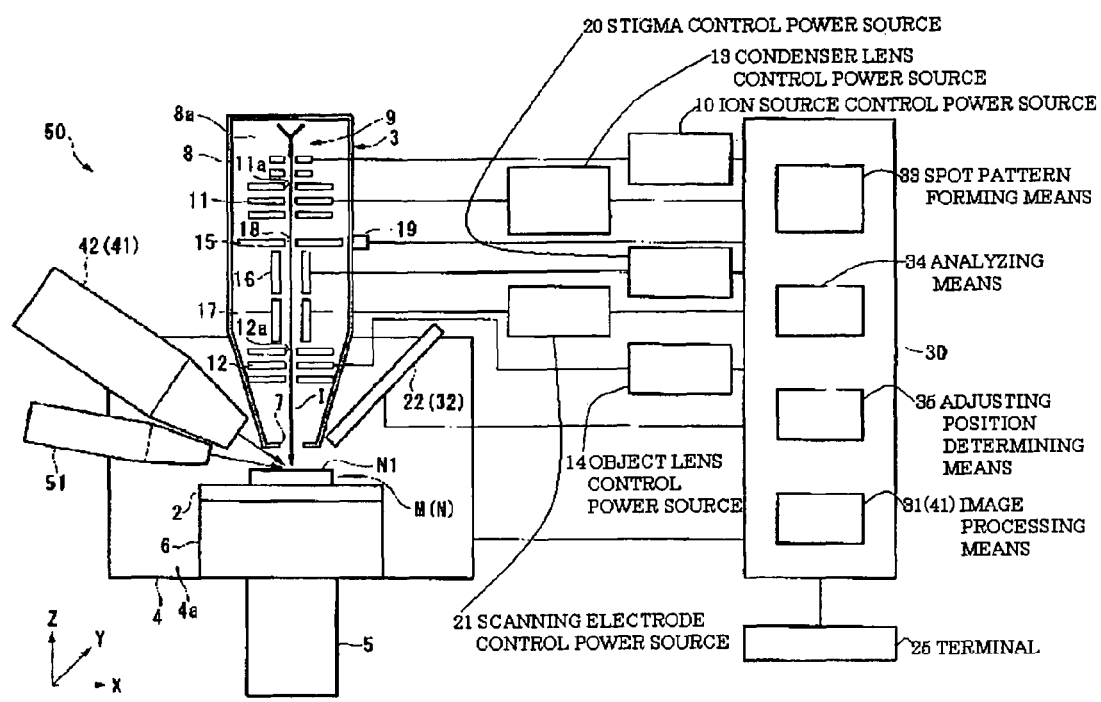
FIG. 9 is a schematic view of a charged particle beam apparatus according to a third embodiment of the invention.

FIG. 9 shows a second embodiment according to the invention. According to the embodiment, members common to members used in the above-described embodiments are attached with the same notations and an explanation thereof will be omitted.

As shown by FIG. 9, a focused ion beam apparatus 50 of the embodiment further includes a rare gas ion beam lens-barrel 51. The rare gas ion beam lens-barrel 51 can irradiate a rare gas ion of, for example, argon ion or the like as an ion beam at a low acceleration, can work a sample without damaging the sample, and is preferably used in finishing of working by a normal ion beam. Even in such a focused ion beam apparatus 50, the axis adjustment of the aperture, not illustrated, of not only the ion beam lens-barrel 3 but also the SEM lens-barrel 42 or the rare gas ion beam lens-barrel 51 can be carried out by a similar method.

Fourth Embodiment

Figure 10:
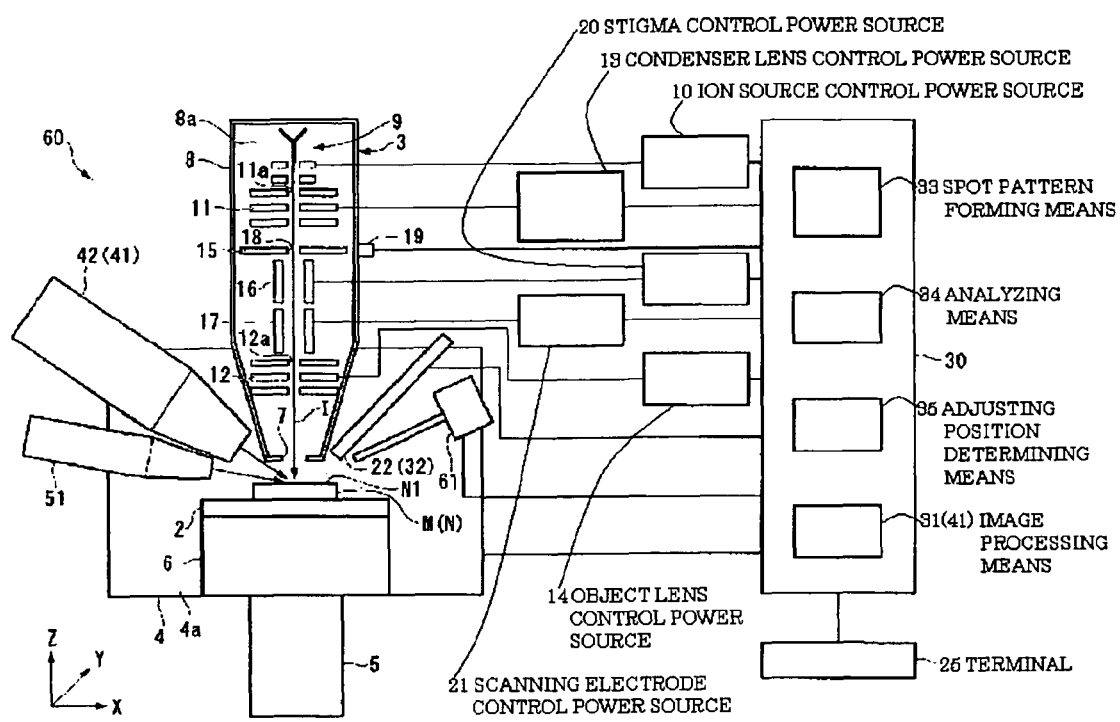
FIG. 10 is a schematic view of a charged particle beam apparatus according to a fourth embodiment of the invention.
Figure 11:
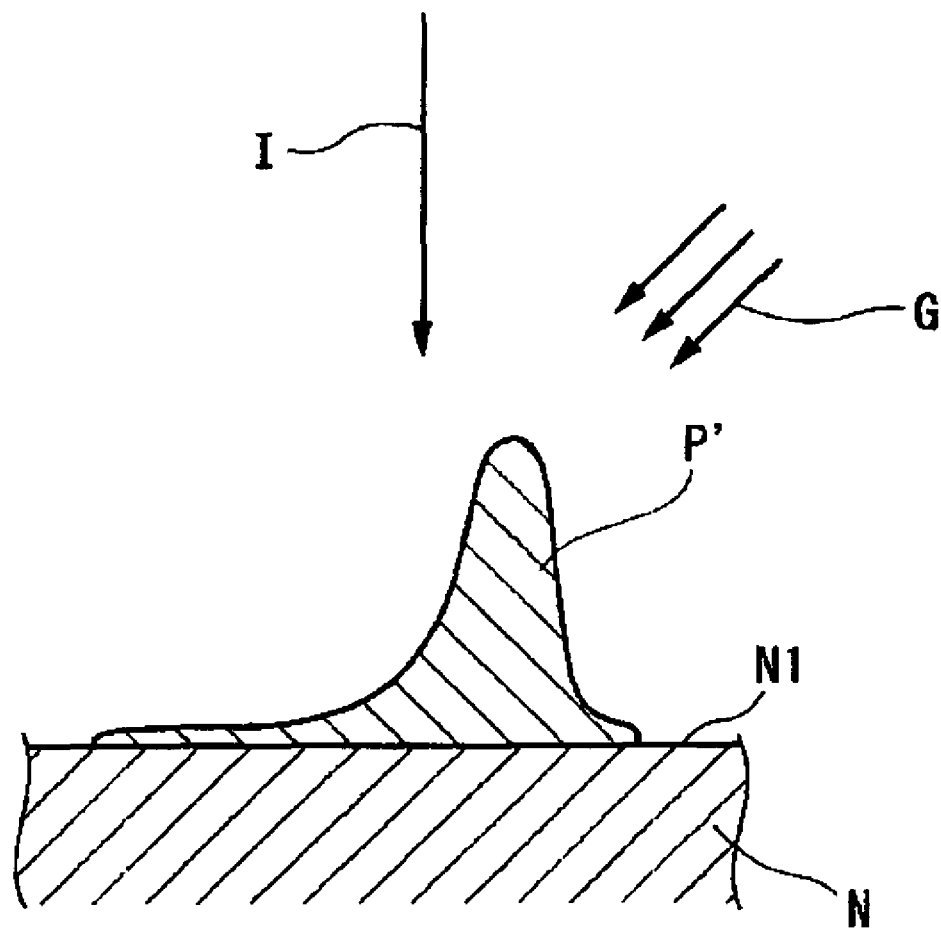
FIG. 11 is a detailed view of a spot pattern formed at a spot pattern forming step of the fourth embodiment of the invention.

FIG. 10 and FIG. 11 show a second embodiment according to the invention. According to the embodiment, members common to members used in the above-described embodiments are attached with the same notations and an explanation thereof will be omitted.

As shown by FIG. 10, a focused ion beam apparatus 60 of the embodiment further includes a gas introducing mechanism 61. In the focused ion beam apparatus 60, deposition can be carried out by introducing an organic gas to the surface of the sample by the gas introducing mechanism 61. Therefore, according to the focused ion beam apparatus 60 of the embodiment, at the spot pattern forming step, the spot pattern is not formed by etching the sample but the spot pattern may be formed by deposition. That is, by introducing an organic gas G by the gas introducing mechanism 61 and irradiating the ion beam I, a spot pattern P' in a projected shape as shown by FIG. 11 is formed at an irradiation position. Even in the spot pattern P' in the projected shape, the axis adjustment of the aperture can be carried out similarly based on the spot pattern P' by enabling to identify the spot pattern P' from the acquired image by the observing means.

Although the embodiments of the invention have been described in details in reference to the drawings as described above, the specific constitution is not limited to the embodiments but includes also a design change or the like within the range not deviated from the gist of the invention.

Further, although as the charged particle beam apparatus, the focused ion beam apparatus are pointed out as examples in the respective embodiments, the charged particle beam apparatus are not limited thereto. For example, an ion beam exposure apparatus or the like is pointed out as the apparatus using an ion beam as a charged particle beam similarly. Further, as apparatus of using an electron beam as a charged particle beam, a scanning electron microscope, an electron beam exposure apparatus or the like is pointed out. Also in the apparatus, by providing a similar constitution as a control portion, the axis of the aperture included therein can easily and accurately be adjusted automatically in a short period of time. Further, although as the standard sample, the standard sample capable of forming the spot pattern by etching or deposition is selected, otherwise, a resist film or the like is selected. In this case, by irradiating a charged particle beam to a resist film constituting a standard sample to expose, a similar adjustment can be carried out by an exposure pattern.

INDUSTRIAL APPLICABILITY

According to the charged particle beam apparatus of the invention, by only providing the spot pattern forming means, the analyzing means., the adjusting position determining means as the control portion and forming the plurality of spot patterns on the sample, the position of the center axis of the aperture can be adjusted automatically, easily and accurately in a short period of time. Therefore, by the simple and accurate adjustment of the position of the center axis of the aperture, accurate observation without dimming can be carried out and accurate working can be carried out.

The invention claimed is:

1. A charged particle beam apparatus comprising:
a charged particle source that emits a charged particle beam;
an aperture that narrows the charged particle beam to a predetermined diameter;
an object lens that focuses the charged particle beam narrowed by the aperture to irradiate the focused charged particle beam to a sample;
observing means for acquiring an image of a surface of the sample;
an aperture driving portion that moves a center axis of the aperture in an X direction and a Y direction constituting two axes substantially orthogonal to each other relative to the center axis; and
a control portion that adjusts a position of the center axis of the aperture relative to a center axis of the object lens by moving the aperture by the aperture driving portion;
wherein the control portion includes:
spot pattern forming means for forming a plurality of spot patterns on the surface of the sample by irradiating the charged particle beam to the sample a plurality of times by moving the aperture to a position different in the X direction and the Y direction by the aperture driving portion;
analyzing means for calculating positions of spot centers constituting centers of the respective spot patterns formed at the sample and a geometrical center position of a halo constituting an outer edge thereof from the image acquired by the observing means; and
adjusting position determining means for calculating an adjusting position of the center axis of the aperture based on a position of intersecting lines connecting the positions of the spot centers of the respective spot patterns and the center position of the halo calculated by the analyzing means; and
wherein a position of the aperture is adjusted by moving the center axis of the aperture to the adjusting position calculated by the adjusting position determining means.

2. The charged particle beam apparatus according to claim 1; further comprising:
scanning means for moving a position of irradiating the charged particle beam relative to the sample;
wherein the spot pattern forming means of the control portion moves the position of irradiating the charged particle beam relative to the sample by the scanning means by amounts of respective moving amounts of the aperture in the X direction and the Y direction multiplied by a constant value at every time of irradiating the charged particle beam to the sample by moving the center axis of the aperture.

3. A method of adjusting an axis of an aperture relative to a center axis of an object lens in a charged particle beam apparatus that narrows a charged particle beam emitted from a charged particle source to a predetermined diameter by the aperture and focuses the charged particle beam by the object lens to be irradiated to a sample, the method comprising:
a spot pattern forming step of forming a plurality of spot patterns on a surface of the sample by making the position of the center axis of the aperture differ in an X direction and a Y direction constituting be two axes substantially orthogonal to the center axis and irradiating the charged particle beam to the previously prepared sample a plurality of times;

a spot analyzing step of calculating positions of spot centers constituting centers of the respective spot patterns and a geometrical center position of a halo constituting an outer edge thereof;

an adjusting position determining step of calculating an adjusting position of the center axis of the aperture based on positions of intersecting lines connecting the center positions of the halos of the respective spot patterns and the position of the spot center; and a center axis position adjusting step of moving the center axis of the aperture to the calculated adjusting position.

4. The method of adjusting an axis of an aperture according to claim 3; wherein in the spot pattern forming step, a position of irradiating the charged particle beam is moved relative to the sample by amounts of respective moving amounts in the X direction and the Y direction of the aperture multiplied by a constant value at every time of irradiating the charged particle beam to the sample by moving the center axis of the aperture.

5. The method of adjusting an axis of an aperture according to claim 4; wherein in the spot pattern forming step, the charged particle beam focused by the object lens is irradiated to the sample in a state of an over focal point.

6. The method of adjusting an axis of an aperture according to claim 5; wherein in the spot pattern analyzing step, an image of the surface of the sample formed with the spot pattern is binarized to produce binarized data, and the center positions of the halos of the respective spot patterns and the position of the spot center are calculated from the binarized data.

7. The method of adjusting an axis of an aperture according to claim 4; wherein in the spot pattern forming step, the charged particle beam focused by the object lens is irradiated to the sample in a state of an over focal point.

8. The method of adjusting an axis of an aperture according to claim 4; wherein in the spot pattern analyzing step, an image of the surface of the sample formed with the spot pattern is binarized to produce binarized data, and the center positions of the halos of the respective spot patterns and the position of the spot center are calculated from the binarized data.

9. The method of adjusting an axis of an aperture according to claim 3; wherein in the spot pattern forming step, the charged particle beam focused by the object lens is irradiated to the sample in a state of an over focal point.

10. The method of adjusting an axis of an aperture according to claim 3; wherein in the spot pattern analyzing step, a binarized data of processing to binarize the image of the surface of the sample formed with the spot pattern is formed, and the center positions of the halos of the respective spot patterns and the position of the spot center are calculated from the binarized data.

11. The charged particle beam apparatus according to claim 2; wherein the control portion sets the charged particle beam to the sample in a state of an over focal point when the charged particle beam is irradiated to the sample by the spot pattern forming means.

12. The charged particle beam apparatus according to claim 11; wherein the analyzing means of the control portion binarizes the image acquired from the observing means to produce binarized date and calculates the center position of the halo and the position of the spot center of the spot pattern based on the binarized data.

13. The charged particle beam apparatus according to claim 2; wherein the analyzing means of the control portion constitutes a binarized data constituted by processing to binarizes the image acquired from the observing means to produce binarized date and calculates the center position of the halo and the position of the spot center of the spot pattern based on the binarized data.

14. The charged particle beam apparatus according to claim 1; wherein the analyzing means of the control portion binarizes the image acquired from the observing means to produce binarized date and calculates the center position of the halo and the position of the spot center of the spot pattern based on the binarized data.

15. The charged particle beam apparatus according to claim 1; wherein the control portion sets the charged particle beam to the sample in a state of an over focal point when the charged particle beam is irradiated to the sample by the spot pattern forming means.

\* \* \* \* \*